(12) United States Patent
Roeckner et al.

(10) Patent No.: US 7,312,654 B2
(45) Date of Patent: Dec. 25, 2007

(54) QUIET POWER UP AND POWER DOWN OF A DIGITAL AUDIO AMPLIFIER

(75) Inventors: William J. Roeckner, Carpentersville, IL (US); Pallab Midya, Palatine, IL (US); Patrick L. Rakers, Kildeer, IL (US); Lawrence E. Connell, Naperville, IL (US); Daniel A. Mavencamp, Dallas, TX (US); Bradley C. Stewart, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 11/314,203

(22) Filed: Dec. 20, 2005

(65) Prior Publication Data

US 2007/0139103 A1    Jun. 21, 2007

(51) Int. Cl.
H03F 3/38    (2006.01)
(52) U.S. Cl. .......................................... 330/10; 330/251
(58) Field of Classification Search .................. 330/10, 330/51, 7 A
See application file for complete search history.

(56) References Cited

U.S. PATENT DOCUMENTS

| | | | | |
|---|---|---|---|---|
| 6,016,075 A | * | 1/2000 | Hamo | 330/10 |
| 6,300,825 B1 | * | 10/2001 | Dijkmans et al. | 330/10 |
| 6,476,672 B2 | * | 11/2002 | Berkhout | 330/10 |
| 6,504,427 B2 | | 1/2003 | Midya et al. | |
| 6,538,590 B1 | | 3/2003 | Gaboriau et al. | |
| 6,556,159 B1 | | 4/2003 | Fei et al. | |
| 6,593,806 B1 | * | 7/2003 | Melanson | 330/10 |
| 6,720,825 B2 | | 4/2004 | Hansen et al. | |
| 6,853,325 B2 | | 2/2005 | Arizumi et al. | |
| 7,161,421 B2 | * | 1/2007 | Honda | 330/10 |
| 2005/0083115 A1 | | 4/2005 | Risbo | |

* cited by examiner

Primary Examiner—Henry Choe
(74) Attorney, Agent, or Firm—Brinks, Hofer, Gilson & Lione

(57) ABSTRACT

A closed loop audio amplifier system and method of powering up/down the system without producing audible artifacts are provided. During power up, a prebias voltage is provided to each output connected to a speaker to increase the voltage to a nominal output level. High impedance switches are then driven at a 50% duty cycle. Feedback from the output is supplied to a servo, which is enabled to fine tune the output voltage. Low impedance switches are then driven at a 50% duty cycle at a quarter cycle timing. The order of the feedback loop depends on which of the high or low impedance switches are driven. The prebias voltage is then removed before audio signals to be amplified are supplied to the system. Timing of driving of the switches is programmable. To power down, essentially the reverse sequence is provided.

25 Claims, 9 Drawing Sheets

QUIET POWER UP AND POWER DOWN OF A DIGITAL AUDIO AMPLIFIER

TECHNICAL FIELD

The present embodiments relate to an amplifier. More specifically, the present embodiments relate to a digital audio amplifier and method of producing the amplifier.

BACKGROUND

Digital audio switching power amplifiers, also called class D amplifiers, are used in various devices, such as in audio systems to drive one or more speakers. Digital audio switching power amplifiers operate in the digital domain using digitally generated pulse width modulated (PWM) signals rather than the traditional analog signal generated using digital-to-analog conversion. More specifically, a digital input audio signal is converted into a digital PWM signal. Typically, the PWM signal contains pulses having a constant frequency and duty cycles proportional to the amplitude of the instant input signal. In other words, the width of the PWM pulse varies with the quantized amplitude of the input signal. The PWM signal switches power transistors between their 'on' and 'off' states to produce an amplified PWM signal. The amplified PWM signal is typically filtered using a passive LC (inductor, capacitor) low pass filter to generate an equivalent analog output for the speakers connected to the amplifier.

The digital switching nature of switching power amplifiers can make it difficult to power them up or down without an audible 'pop' or 'click'. This occurs when the system is powered up/powered down due to, for example, DC transients in charging/discharging of a coupling capacitor disposed between the amplifier and the speakers to the operational DC bias level. To avoid audible artifacts during power up/down, all DC transients that can reach the speaker are typically slowed down to sub-audible transition rates. However, the operational DC bias level of the amplifier is not exactly predictable. In particular, the DC bias level of a switching amplifier that incorporates a feedback circuit for correcting power stage non-idealities depends upon component matching of both integrated and/or non-integrated circuit components, making it very difficult to accurately predict the operational DC bias. Therefore, a method is needed to gracefully power up and power down a closed loop digital switching amplifier so as to avoid audible artifacts.

BRIEF DESCRIPTION OF THE DRAWINGS

The present invention is illustrated by way of example and not limited to the accompanying figures in which like references indicate similar elements.

Skilled artisans appreciate that elements in the figures are illustrated for simplicity and clarity and have not necessarily been drawn to scale.

DETAILED DESCRIPTION

A digital audio switching amplifier system having a quiet power up and power down sequence and method of powering up/down without generating audible artifacts are provided. The closed loop system initially provides a prebias and then later drives sets of output switches. A first set of output switches provides a small amplitude output. A second set of output switches provides a large amplitude output. The output from the switches is supplied to a feedback circuit that generates a correction adjustment for the closed loop system. The correction adjustment is supplied to a servo that modifies the DC bias to compensate for the loop such that the adjustment is not saturated. The system thus gracefully transitions between an off state and a power up state having a nominal DC bias and in which the duty cycle of the pulse width modulation (PWM) pulses is 50%.

Under steady state conditions, i.e. steady state switching at a particular duty ratio, the switching typically occurs at about 300 kHz to 400 kHz. As the human auditory range extends from about 20 Hz to 20 kHz, the switching in the steady state is not audible. However, when powering a digital audio switching power amplifier system up or down, the transition from no switching of FETs driving a speaker to switching the FETs at any duty ratio will produce DC transients which can cause an audible tone to be emitted from the speaker. These DC transients arise, for example, from non-idealities or mismatching of components in the power stage IC such as mismatches in the FETs, from charging of a capacitor in an LC filter between a power stage and the speaker, or from offsets in op-amps of analog integrators along a feedback loop of the system. The magnitude of the DC transients created by these elements are difficult at best to predict, especially if an empirical measurement of the DC transients is made when the system is open loop and then the feedback loop is added.

Accordingly, while DC bias offset itself is inaudible in steady state switching mode, the change in the DC offset may be audible. Whether or not the change is audible depends on the magnitude of the change and the rate of change. Thus, by slowing down and/or decreasing the magnitude of the transients when transitioning between a non-power up state and a power up state, audibility of the artifacts can be eliminated.

Figure 1:
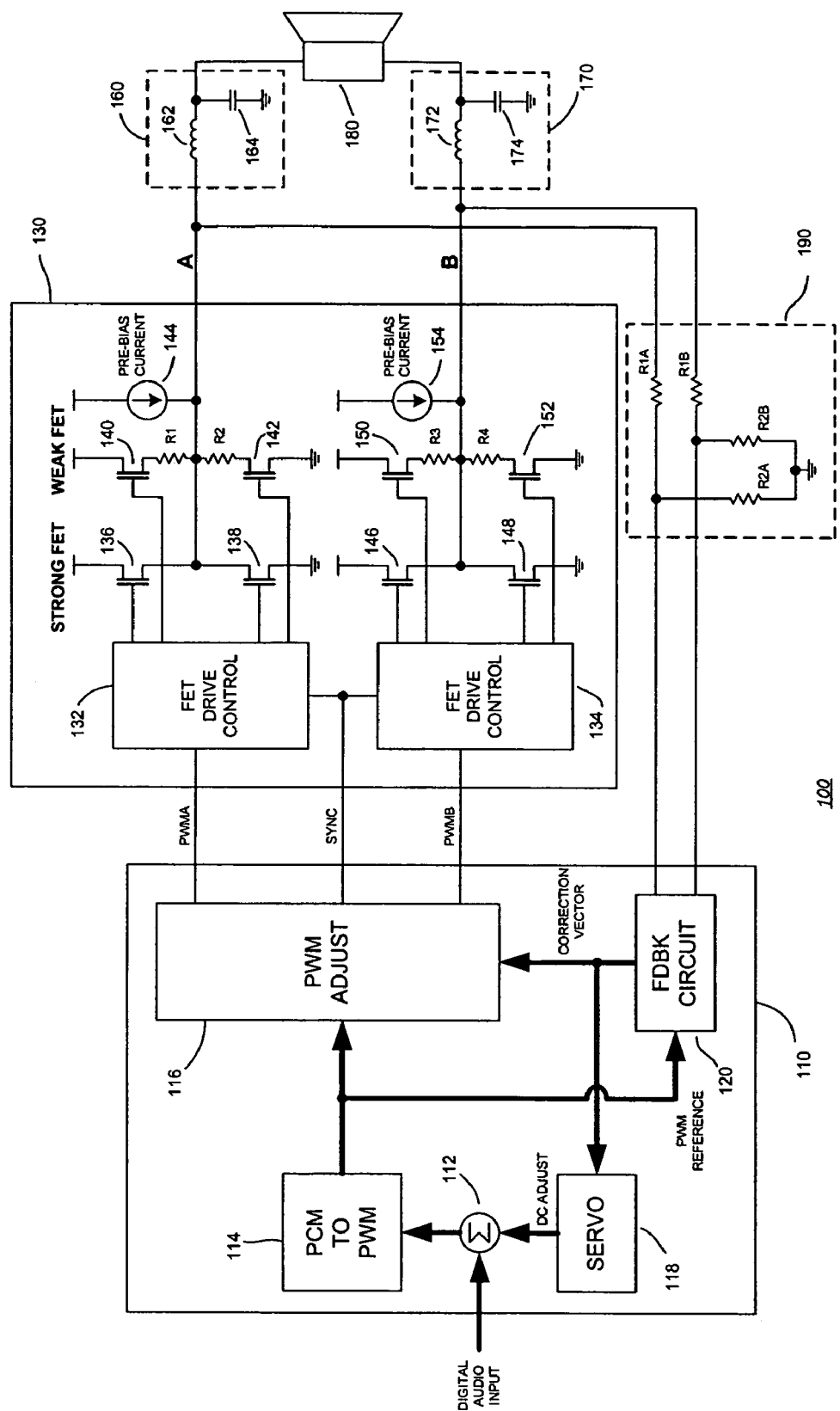
FIG. 1 illustrates one embodiment of a digital audio system.

A closed loop amplifier system in which the DC transients are slowed down and/or decreased in magnitude is illustrated in FIG. 1. As shown, the closed loop amplifier system 100 includes a digital amplifier controller IC 110 and a power amplifier stage IC 130. As shown, the controller IC 110 contains a summer 112, a PCM to PWM converter 114, a PWM adjuster 116, a servo 118, and a feedback circuit 120. The feedback circuit 120 includes a continuous time loop filter and a multi-bit quantizer (analog-to-digital converter). Other components in the controller IC 110, well known in the art, are not shown for clarity.

The digital amplifier controller IC 110 receives a digital audio signal supplied to an input of the digital amplifier controller IC 110. The digital audio signal, in one embodiment, is a pulse code modulation (PCM) signal. The PCM signal represents an analog signal that has been sampled at a particular rate, usually 8 to 192 kHz, and recorded as a digital number, usually 8 to 24 bits long.

The PCM signal is supplied to an input of the summer 112. Another input of the summer 112 is supplied with a digital DC adjust signal from the servo 118. The DC adjust signal contains information about the DC offset provided by the feedback loop described below. A summed signal from an output of the summer 112 is supplied to an input of the PCM to PWM converter 114. The PCM to PWM converter 114 converts the PCM signal to a pulse width modulated (PWM) signal. The PWM signal is a stream of pulses having duty cycles (i.e. widths) proportional to the stream of digital samples of the PCM signal. The pulses of the PWM signal usually have a constant frequency. This frequency can be, for example, the sample rate of the PCM signal.

The PWM signal is supplied from an output of the PCM to PWM converter 114 to an input of the PWM adjuster 116. Another input of the PWM adjuster 116 is supplied with a correction vector from an output of the feedback circuit 120. The correction vector is, for example, a 7-bit vector provided from an analog-to-digital converter (ADC) in the feedback circuit 120. The PWM adjuster 116 adjusts the duty cycles of the pulses and provides several signals from its outputs. The PWM adjuster 116 provides a first adjusted PWM output signal PWMA from a first output, a second adjusted PWM output signal PWMB from a second output, and a synchronization signal SYNC from a third output. These outputs are provided from the outputs of the digital amplifier controller IC 110. Other outputs may be provided in addition from the digital amplifier controller IC 110, but are not shown for clarity.

As illustrated in FIG. 1, the correction vector from the feedback circuit 120 is provided to an input of the servo 118 in addition to the PWM adjuster 116. The feedback circuit 120 provides cycle-by-cycle correction to the PWM output of the digital amplifier controller IC 110. An additional input (a nonadjusted PWM signal) is also supplied to the feedback circuit 120. This input acts as a PWM reference to which the feedback signal is compared. This PWM reference is derived directly from the output of the PCM to PWM converter 114 and therefore contains the dc adjust information. The servo 118 forms the DC adjust signal based on the correction vector from the feedback circuit 120. A more detailed description of the servo 118 is provided below. The feedback circuit 120 forms the correction vector based on signals supplied to inputs of the feedback circuit 120. An attenuator circuit 190 provides attenuated outputs of the power stage IC 130 which are supplied to inputs of the digital amplifier controller IC 110, which are connected to the inputs of the feedback circuit 120. The order of the feedback loop can be adjustable. That is, although not shown, the feedback circuit 120 can contain multiple integrators (e.g. operational amplifiers having a capacitor between the output and the inverting input) whose effects are removable from the feedback loop to increase the stability of the feedback loop. In one example, the feedback loop can be adjusted from a first order feedback loop to a third order feedback loop.

As above, in the power up state, the system has pulses with a nominal DC bias and a 50% duty cycle. However, the feedback circuit 120 by itself has a limited range of signals it can supply to the PWM adjuster 116, thereby limiting the range over which the duty cycle can be adjusted. For example, the PWM adjuster 116 can adjust the duty cycle over about a 50% range, from about 25% to 75%. Thus, during transition into the power up state, the integrators in the feedback circuit 120 can saturate and give a maximum correction in attempting to adjust the pulse width. This limits the ability of the feedback circuit 120 to quickly settle into the power up mode. The addition of the servo 118 permits adjusting of the pulse width without saturation of the feedback circuit 120. The servo 118 compensates for at least the bulk of the DC offset in the feedback loop by altering the PCM signal supplied to the PCM to PWM converter 114 thereby injecting a DC correction into the feedback loop. The servo 118 can operate throughout the transition between the power up and power down states as well as during normal operation, throughout the transition and then being ramped up or down during normal operation, or only over a portion of the transition (e.g. in the weak FET mode but not in the strong FET mode, both of which are described below). In general, the gain of the system when in the weak FET mode is too low for proper operation.

The power stage IC 130 contains field effect transistor (FET) drive controllers 132 and 134. Associated with each FET drive controller 132, 134 are multiple pairs of FETs 136 and 138, 146 and 148, 140 and 142, and 150 and 152, a pair of resistors R1 and R2, R3 and R4, and a pre-bias current source 144 and 154. Although only two FET drive controllers 132 and 134 are shown in the power stage IC 130, any number of FET drive controllers can be provided depending, for example, on the number of output channels to the various speakers in the system.

The first output signal PWMA, second output signal PWMB and synchronization signal SYNC from the digital amplifier controller IC 110 are provided to inputs of the power stage IC 130, which are connected to inputs of the FET drive controllers 132 and 134. More specifically, the first output signal PWMA and synchronization signal SYNC are provided to the inputs of the first FET drive controller 132, while the second output signal PWMB and synchronization signal SYNC are provided to the inputs of the second FET drive controller 134.

The outputs of the first FET drive controller 132 are connected to the first set of FETs 136, 138, 140, 142, separated into "strong" FETs 136, 138 and "weak" FETs 140, 142. The strong FETs 136, 138 are relatively low impedance FETs, having an impedance of about 0.1 ohm to 1 ohm. The weak FETs 140, 142 (also called high impedance FETs) provide a relatively high impedance of about 1 kohm to 10 kohm between the rail voltages and the output node A. This high impedance is illustrated in FIG. 1 by resistors R1, R2 disposed between the weak FETs 140, 142 and the output node A. The high impedance can be implemented using resistors external to the FET or using FETs with a higher internal resistance, or a combination thereof. Thus, the term "high impedance FET" can refer to a FET with a relatively high internal resistance or a FET with a relatively low internal impedance connected in series with a high impedance resistor. The strong FETs 136, 138 and/or weak FETs 140, 142 are disposed in the power stage IC 130 and thus are implemented with integrated FETs.

As above, the outputs of the first FET drive controller 132 are connected to the first set of FETs 136, 138, 140, 142. More specifically, a first pair of outputs of the first FET drive controller 132 is connected to the gates of a first pair of strong FETs 136, 138 and a second pair of outputs of the first FET drive controller 132 is connected to the gates of a first pair of weak FETs 140, 142.

Each of the first pair of strong FETs 136, 138 and the first pair of weak FETs 140, 142 is connected between the power supply rails, e.g. the supply voltage and ground. The power supply voltage can be, for example, a battery voltage or derived from a wall socket voltage. The first strong FET 136 is connected between the power supply and an output (first output A) of the power stage IC 130 (i.e. the source and drain are connected to the power supply and first output A) while the second strong FET 138 is connected between the first output A of the power stage IC 130 and ground. The first weak FET 140 is connected between the power supply and the first output A of the power stage IC 130 through the first resistor R1 while the second weak FET 142 is connected between the first output A of the power stage IC 130 and ground through the second resistor R2. The first pre-bias current source 144 is also provided between the power supply and the first output A.

Similarly, the outputs of the second FET drive controller 134 are connected to the second set of FETs 146, 148, 150 and 152. More specifically, a first pair of outputs of the second FET drive controller 134 is connected to the gates of a second pair of strong FETs 146 and 148 and a second pair of outputs of the second FET drive controller 134 is connected to the gates of a second pair of weak FETs 150 and 152. Each of the second pair of strong FETs 146 and 148 and the second pair of weak FETs 150 and 152 is connected between the power supply rails, e.g. the supply voltage and ground. The third strong FET 146 is connected between the power supply and another output (second output B) of the power stage IC 130 (i.e. the source and drain are connected to the power supply and second output B) while the fourth strong FET 148 is connected between the second output B of the power stage IC 130 and ground. The third weak FET 150 is connected between the power supply and the second output B of the power stage IC 130 through the third resistor R3 while the fourth weak FET 152 is connected between the second output B of the power stage IC 130 and ground through the fourth resistor R4. The second pre-bias current source 154 is also provided between the power supply and the second output B.

Accordingly, the voltage provided from the output of the digital amplifier controller IC 110 is a nominal logic voltage level (e.g. 3.3V). This voltage is amplified by the strong FETs 136, 138, 146, 148 to a larger signal swing of the rail voltages. Thus, this swing is application dependent and can be, for example, the voltage provided by a portable electronic device battery voltage, a car battery voltage, or a 70 volt rail. The signal produced at the outputs A and B when the weak FETs 140, 142, 150, 152 are operational is reduced by a voltage divider formed by the resistor pairs R1 and R2, R3 and R4 and the impedance of speaker 180. Accordingly, when the strong FETs 136, 138, 146, 148 are active, each of the first and second outputs A, B is grounded or supplied with the power supply voltage.

The speaker 180 is driven differentially by the power stage IC 130 in a full-bridge configuration. Each of the first and second outputs A and B drives one side of the speaker 180 through a low pass filter 160 and 170. Each of the first and second low pass filter 160 and 170 contains an LC filter that includes an inductor 162, 172 between the power stage IC 130 and the speaker 180 and a capacitor 164, 174 between the speaker terminals and ground. The first and second low pass filters 160, 170 remove artifacts due to switching and recover the original audio signal recorded in the media from which the input digital audio signal is supplied.

Attenuated signals from each of the first and second outputs A and B is supplied to the feedback circuit 120 in the digital amplifier controller IC 110. More specifically, the first and second outputs A and B are tapped at a node between the power stage IC 130 and the LC filters 160, 170. The signals from these nodes are supplied to the feedback circuit 120 in the digital amplifier controller IC 110 through an attenuator 190. As shown, the attenuator 190 may contain a simple voltage divider circuit for each of the first and second outputs A and B. The attenuator 190 includes a first resistor R1A between the node for the first output A and the controller IC 110 and a second resistor R2A between the first resistor R1A and ground. Similarly, the attenuator 190 includes a third resistor R1B between the node for the second output B and the controller IC 110 and a fourth resistor R2B between the third resistor R1B and ground. The resistances of the attenuator 190 are selected such that the voltage swings of the strong FETs 136, 138, 146, 148 and the weak FETs 140, 142, 150, 152 is attenuated to a voltage range that the digital amplifier controller IC 110 can handle. Accordingly, if the voltage swing provided from the power stage IC 130 is within the acceptable voltage range of the digital amplifier controller IC 110, the attenuator 190 may be eliminated.

Examples of timing diagrams for power up and power down sequences are shown in FIGS. 2-5 for both standard PWM modulation and suppressed carrier PWM modulation. The time scale is compressed for illustration purposes. One end point of these figures is a power off state of the system in which the DC bias point is 0 and no PWM signals are provided to the speaker, while the other end point of the system is a power up state having nominal DC bias point (about one half of the rail voltage) and a PWM signal supplied to the speakers has a 50% duty cycle.

Each of the examples in FIGS. 2-5 contains multiple timing diagrams, which include the synchronization signal SYNC, the first output signal PWMA, the second output signal PWMB and a servo enable signal SERVO_EN that activates the servo 118 in the digital amplifier controller IC 110. In addition, timing diagrams from the power stage IC 130 include a first output of the first FET drive controller 132 WEAK_FET_A_HI supplied to the gate of the first weak FET 140, a second output of the first FET drive controller 132 WEAK_FET_A_LO supplied to the gate of the second weak FET 142, a third output of the first FET drive controller 132 STRONG_FET_A_HI supplied to the gate of the first strong FET 136, a fourth output of the first FET drive controller 132 STRONG_FET_A_LO supplied to the gate of the second strong FET 138, a first output of the second FET drive controller 134 WEAK_FET_B_HI supplied to the gate of the third weak FET 150, a second output of the second FET drive controller 134 WEAK_FET_B_LO supplied to the gate of the fourth weak FET 152, a third output of the second FET drive controller 134 STRONG_FET_B_HI supplied to the gate of the third strong FET 146, a fourth output of the second FET drive controller 134 STRONG_FET_B_LO supplied to the gate of the fourth strong FET 148, and the voltages and currents for the first and second outputs A, B.

Figure 2:
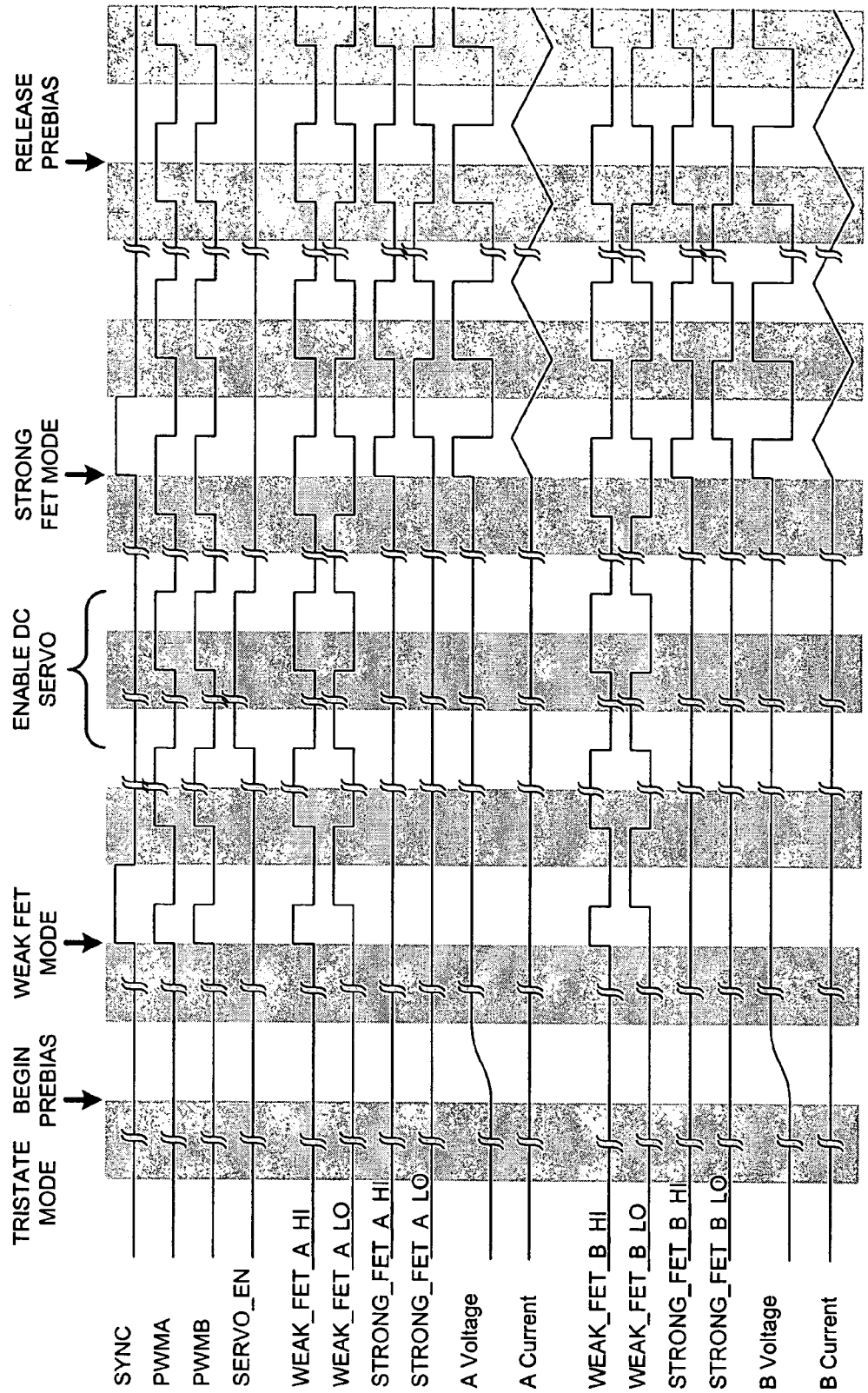
FIG. 2 illustrates timing diagrams of a power up sequence for suppressed carrier PWM modulation in the system of FIG. 1.

As shown in FIG. 2, the power up sequence begins in tristate mode, in which all of the FETs 136, 138, 140, 142, 146, 148, 150, 152 are off. In the tristate mode, the feedback circuit 120 is in zeroth order, i.e. the feedback circuit 120 is inactive and the system is essentially an open loop. The prebias current source 144, 154 first supplies a current to the first or second output A, B. The current from the prebias current source 144, 154 charges the capacitor 164, 174 in the LC filter 160, 170, thereby ramping the DC bias at the output nodes to the nominal value. This nominal value is close to the steady state value and may be one half of the power supply voltage. The DC bias is ramped so that no audible artifacts exist. The speed of the ramping may be determined empirically. In this embodiment, the nominal DC voltage at output A is equal to the current of prebias current source 144 multiplied by the sum of attenuation resistors R1A, R2A. Similarly, the nominal DC voltage at output B is equal to the current of prebias current source 154 multiplied by the sum of attenuation resistors R1B, R2B.

When the system 100 transitions into the weak FET mode, after the nominal DC bias is reached, the first output signal PWMA, second output signal PWMB, and synchronization signal SYNC supplied from the digital amplifier controller IC 110 are provided to inputs of the power stage IC 130. The synchronization signal SYNC may be a single pulse. The initial pulses from the first output signal PWMA and the second output signal PWMB may be the same and may have a 25% duty cycle and after one period have a 50% duty cycle.

In the weak FET mode, the first output signal PWMA, second output signal PWMB, and synchronization signal SYNC activate the first output of the first FET drive controller 132 WEAK_FET_A_HI, the second output of the first FET drive controller 132 WEAK_FET_A_LO, the first output of the second FET drive controller 134 WEAK_FET_B_HI, and the second output of the second FET drive controller 134 WEAK_FET_B_LO. As the power stage IC 130 does not have a clock, the rising edge of the synchronization signal SYNC supplied to the power stage IC 130 is detected by the power stage IC 130 and used to trigger the transition into the weak FET mode. In an alternate embodiment, the rising edge of the first output signal PWMA and second output signal PWMB supplied to the power stage IC 130 can be detected by the power stage IC 130 and used to trigger the transition.

As illustrated, the first output of the first FET drive controller 132 WEAK_FET_A_HI and the first output of the second FET drive controller 134 WEAK_FET_B_HI mirror the first output signal PWMA and second output signal PWMB, while the second output of the first FET drive controller 132 WEAK_FET_A_LO and the second output of the second FET drive controller 134 WEAK_FET_B_LO are the inverse of the first output signal PWMA and the second output signal PWMB. In weak FET mode the switching transients to the speaker 180 are attenuated to sub-audible levels due to the high impedance of the weak FETS 140, 142, 150, 152. Due to the small level of the voltage and current transients associated with outputs A, B when in weak FET mode, these transients are not illustrated in the timing diagrams of FIG. 2-5.

Additionally, when the system 100 transitions into the weak FET mode, feedback circuit 120 is activated and set to first order, thus closing the feedback loop and allowing the feedback circuit 120 to provide corrections to the PWM adjuster 116. In this mode, the high impedance of the weak FETs 140, 142, 150, 152 produce a reduced loop gain resulting in the likely saturation of the correction vector output from feedback circuit 120.

After a predetermined amount of time in the weak FET mode, the servo 118 is enabled. The servo 118 acts to provide a dc adjust signal to the digital audio input such that the correction vector from feedback circuit 120 is nominally zero, and therefore not saturated. The weak FET mode, in combination with enablement of the servo 118, allows the output DC to inaudibly transition from the nominal value to the true DC bias of the closed loop system 100.

Once the true DC bias of the closed loop system 100 has been reached, the synchronization signal SYNC is again used to transition the system 100 into the strong FET mode. In the strong FET mode, the order of the feedback loop is increased to that of the normal operating mode, for example, a third order feedback loop. In addition, the strong FETs are activated and the weak FETs are deactivated. Alternatively, the weak FETs can remain active since their high impedance is dominated by the low impedance of the strong FETs. The rising edge of the synchronization signal SYNC pulse, and thus the transition from weak to strong FET mode, occurs on a nominal quarter cycle time point to minimize dc transients. At the quarter cycle time point, the inductor currents in the LC filters 160, 170 are nominally zero in steady state. Transitioning to the strong FET mode at this time point thus minimizes the transient current in the inductors 162, 172. Similar to the weak FETs 140, 142, 150, 152, after driving the strong FETs 136, 138, 146, 148 using a 25% duty ratio single pulse, the strong FETs 136, 138, 146, 148 are then driven with 50% duty ratio pulses.

Figure 6:
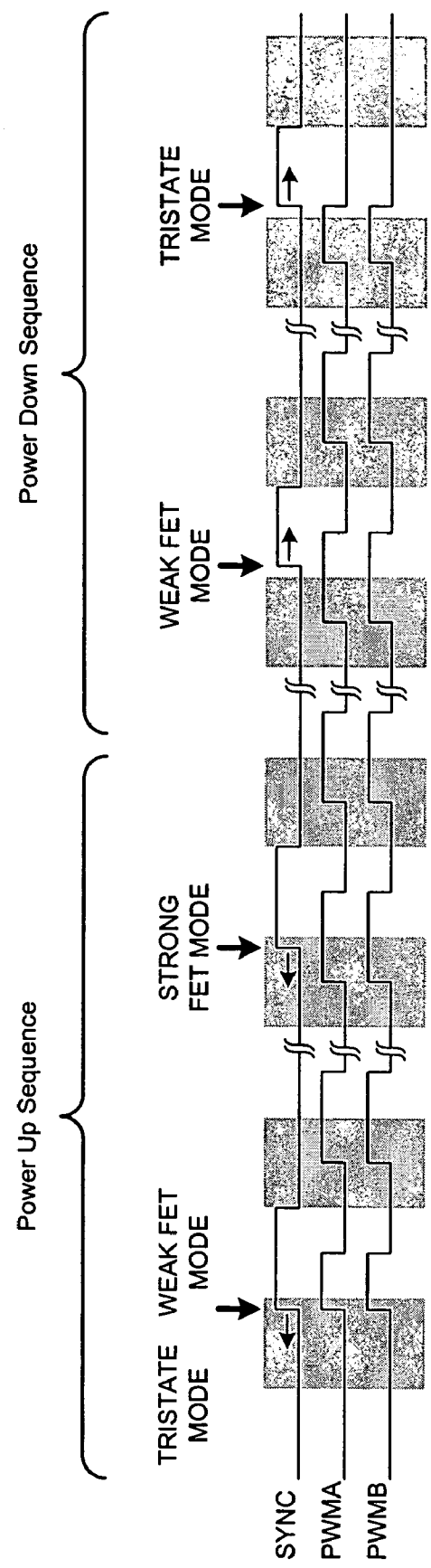
FIG. 6 illustrates timing diagrams of adjustment of the SYNC pulse in the system of FIG. 1.

To accommodate mismatch in the rise and fall times of the FETs 136, 138, 140, 142, 146, 148, 150, 152, the exact starting point of the initial quarter cycle pulse can be software programmable. This allows the user to fine tune the particular system used. The exact starting point may be determined via empirical measurements. For example, if the pulse repetition rate is about 3 μs (about 300 kHz), an adjustment range of about ±80 ns (about ±3.75%) may be used. An example of this is shown in FIG. 6, in which a timing diagram of the synchronization signal SYNC and the corresponding first and second output signals PWMA, PWMB are shown. Note that the rising edge of the synchronization signal SYNC is adjusted in the opposite direction for the power down sequence relative to that of the power up sequence. For example, if the rising edge of the synchronization signal SYNC is advanced in time during the power up sequence then the rising edge of the synchronization signal SYNC is delayed in time during the power down sequence. This results in equal pulse widths for both the first and last pulse during power up and power down.

After another predetermined time, the prebias current can be removed, and modulation of an input audio signal can begin. Alternatively, the prebias current can be maintained during strong FET mode without detrimental effects. In one embodiment, the prebias current is digitally controlled, and the prebias current level can then be digitally stored for use later during the power down sequence.

Figure 4:
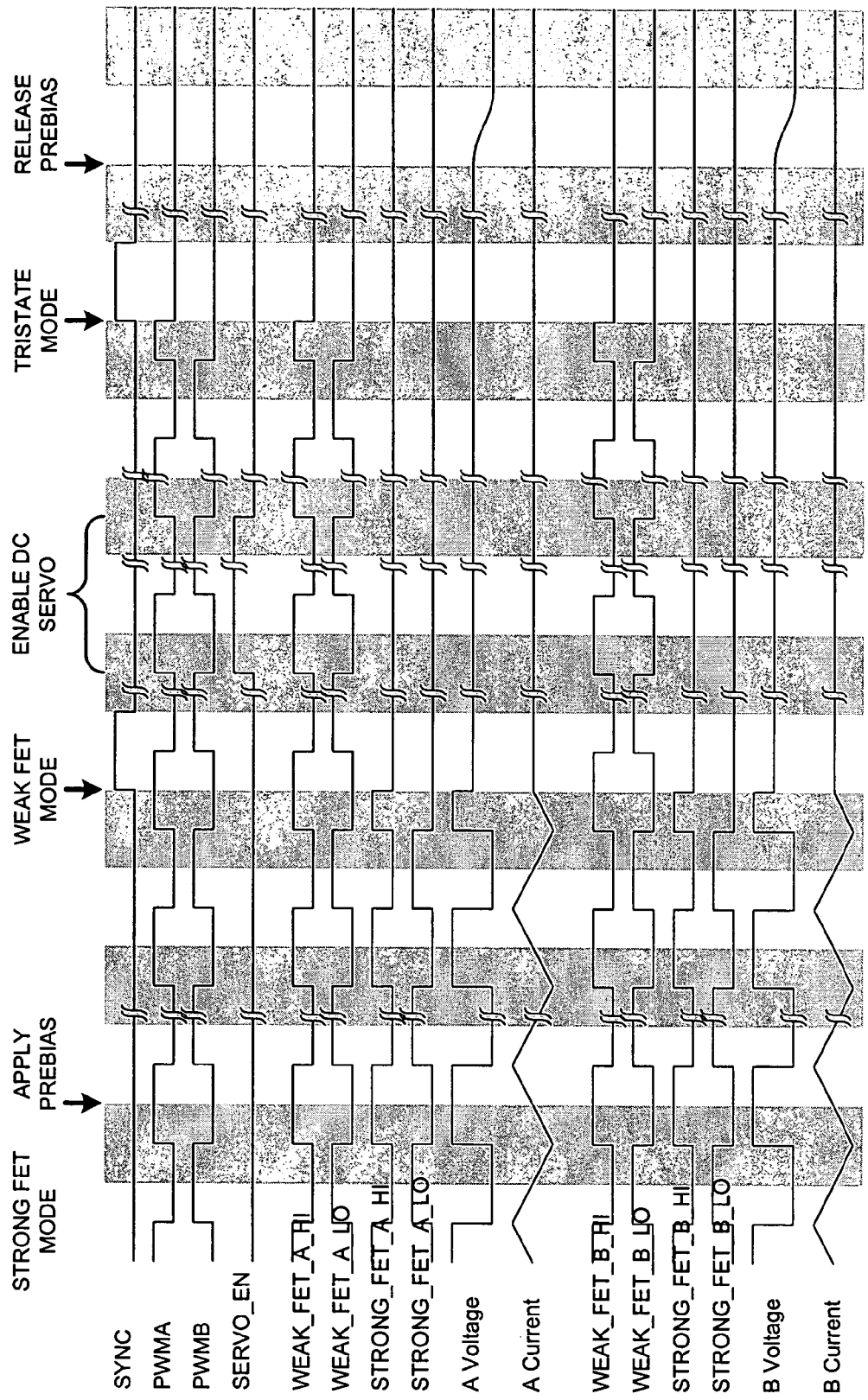
FIG. 4 illustrates timing diagrams of a power down sequence for suppressed carrier PWM modulation in the system of FIG. 1.

The power down sequence for suppressed carrier PWM modulation shown in FIG. 4 is performed in the opposite order from the power up sequence for suppressed carrier PWM modulation shown in FIG. 2. The system 100 starts in strong FET mode, in which an audio signal is supplied. The audio signal is removed, resulting in output signals PWMA and PWMB having a 50% duty ratio. The prebias current source 144, 154 then supplies a current to the first and second output A, B to maintain the charge on the capacitors 164, 174 while the system is powering down. In a preferred embodiment, in which the prebias current level is digitally controlled, the prebias current level that was digitally stored during the power up sequence is used to provide the prebias current level for the power down sequence. The programmable synchronization signal SYNC is next used to transition the system 100 into the weak FET mode and the order of the feedback loop is reduced. The servo 118 is enabled to prevent the saturation of the feedback circuit 120, and the weak FETs 140, 142, 150, 152 are deactivated using the synchronization signal SYNC to transition the system 100 out of the weak FET mode into the tristate mode, in which all FETs 136, 138, 140, 142, 146, 148, 150, 152 are turned off. The prebias current sources 144, 154 are slowly turned off (sufficiently slow as to be inaudible) and, after the capacitors 164, 174 have drained, the system 100 is in the off state.

Figure 3:
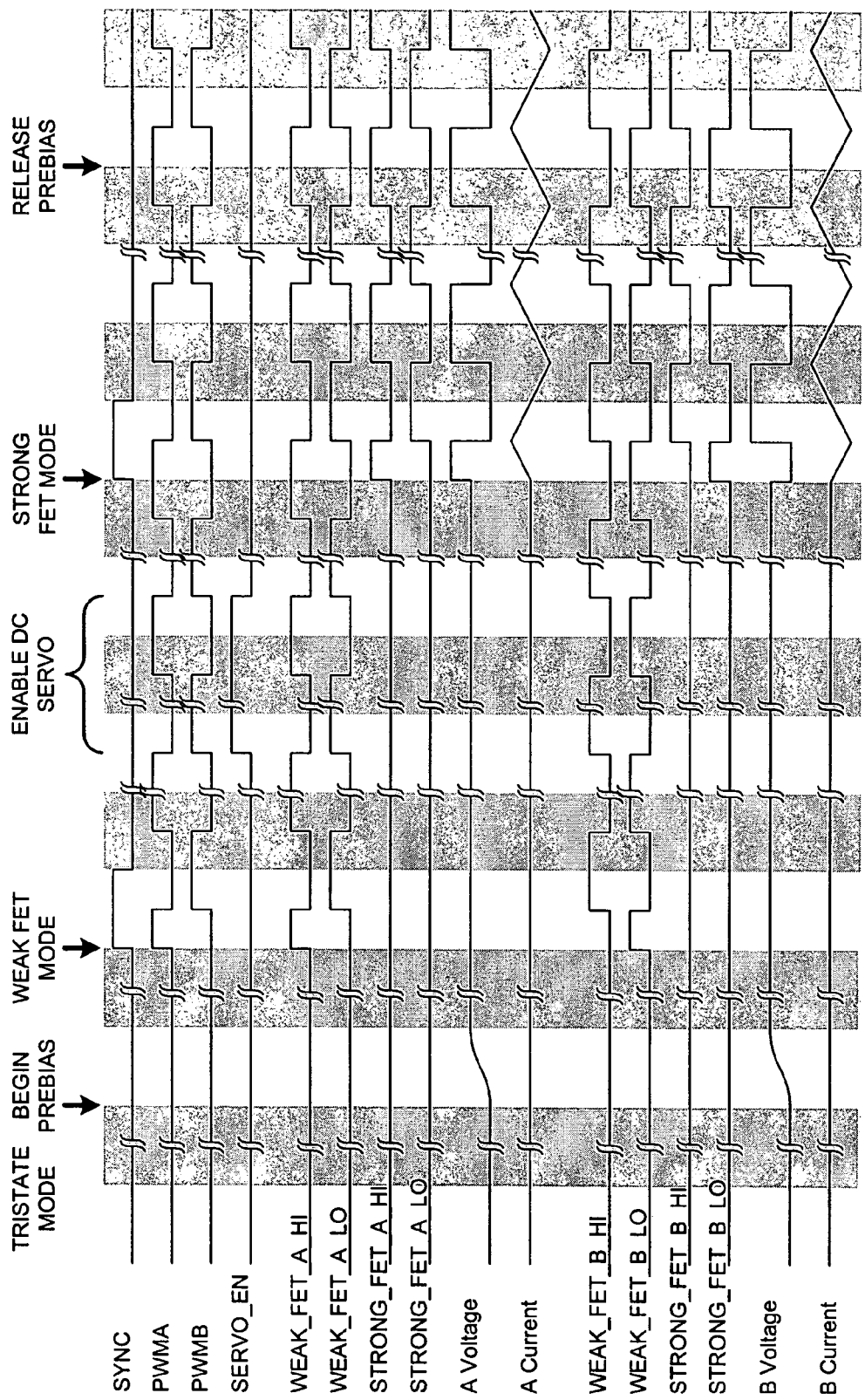
FIG. 3 illustrates timing diagrams of a power up sequence for standard PWM modulation in the system of FIG. 1.
Figure 5:
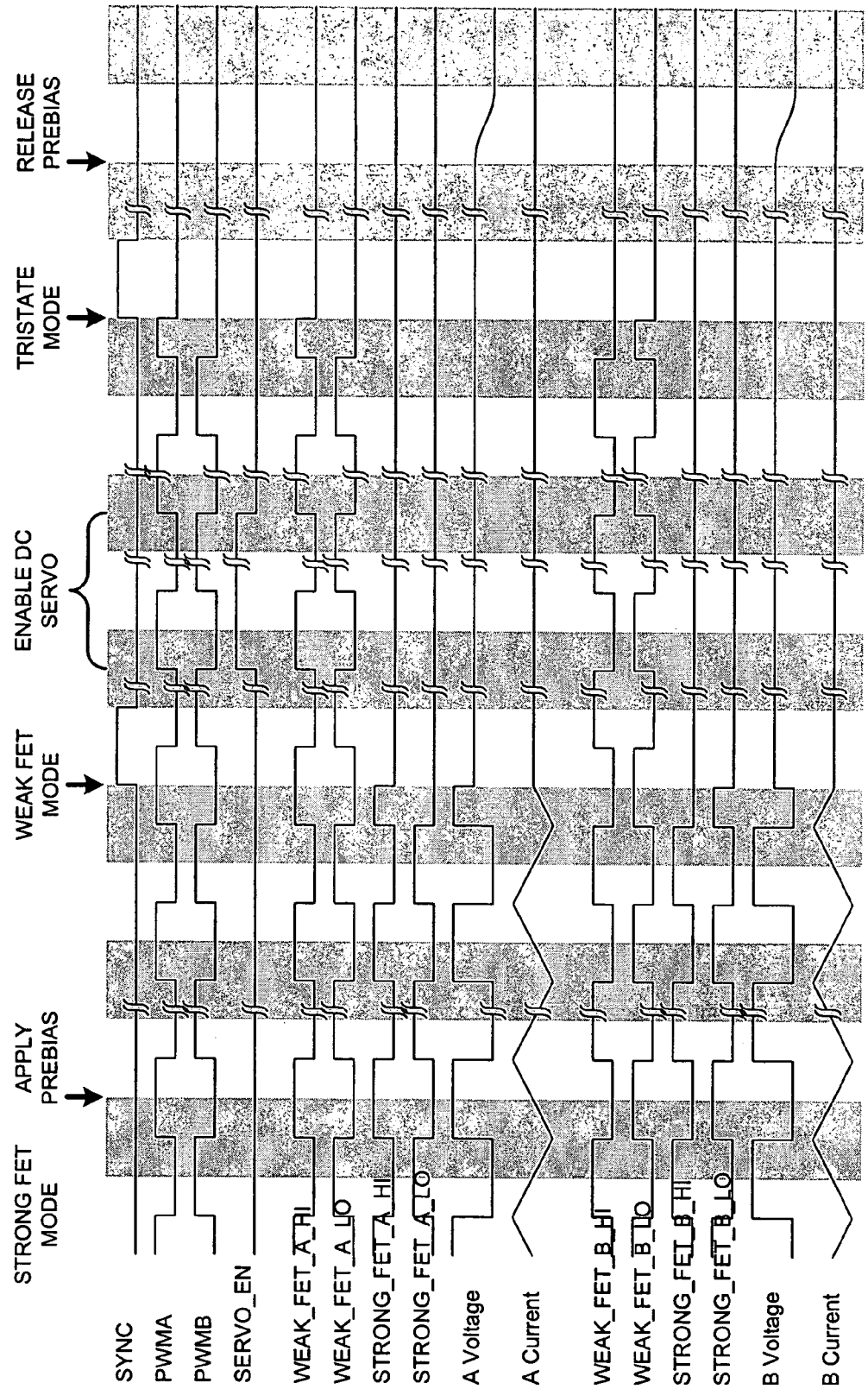
FIG. 5 illustrates timing diagrams of a power down sequence for standard PWM modulation in the system of FIG. 1.

As above, FIG. 2 shows the power up sequence for suppressed carrier PWM modulation. The power up sequence for standard PWM modulation is illustrated in FIG. 3. Although the sequence in FIG. 3 is substantially the same as that of FIG. 2, essentially the polarity of the second output signal PWMB pulses and the second FET drive controller 134 pulses, as well as of the voltage and current pulses on the second output B, are reversed from the suppressed carrier PWM modulation power up sequence shown in FIG. 2. Similarly, the power down sequence for standard PWM modulation illustrated in FIG. 5 is substantially the same as that of FIG. 4, with essentially the polarity of the second output signal PWMB pulses and the second FET drive controller 134 pulses, as well as of the voltage and current pulses on the second output B, reversed from the suppressed carrier PWM modulation power down sequence shown in FIG. 4.

Figure 7:
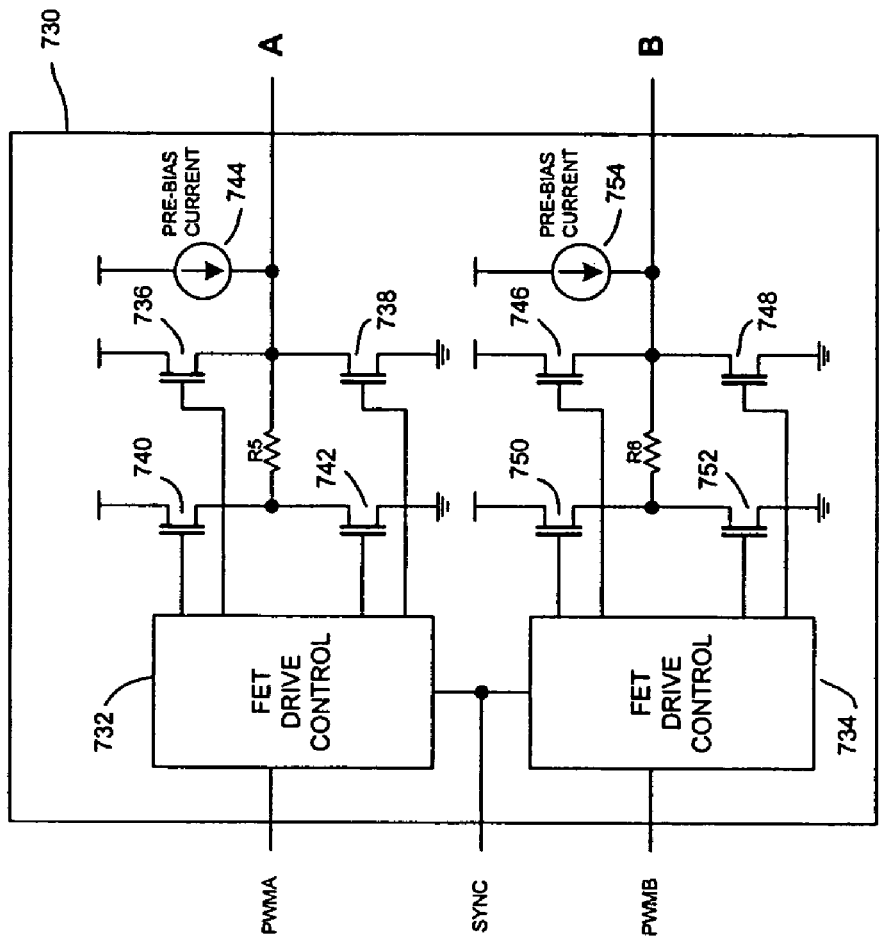
FIG. 7 illustrates another embodiment of a power stage IC.

In the embodiment shown in FIG. 1, the relative positions of the strong and weak FETs connected to a particular FET drive controller may be exchanged. That is, either the strong FETs or the weak FETs can be implemented more proximate to the FET drive controller. In addition, in another embodiment, only a single resistor may be used to provide the weak FETs rather than a resistor being provided between each of the weak FETs and the corresponding power stage IC output. Such a power stage IC 700 is shown in FIG. 7, in which the remainder of the amplifier system is not shown but may be substantially the same as that of FIG. 1. As shown in FIG. 7, the power stage IC 730 contains field effect transistor (FET) drive controllers 732 and 734, strong FETs 736, 738, 746, 748, weak FETs 740, 742, 750 and 752, a single resistor for each IC output R5, R6 and pre-bias current source 744, 754. As shown, only one resistor R5, R6 is provided between the connection point between each pair of weak FETs 740, 742, 750, 752 and the connection point between each pair of strong FETs 736, 738, 746, 748. In this configuration, weak FETs 740, 742, 750, 752 may be low impedance FETs with resistors R5, R6 providing the high impedance required for the weak FET operation.

Figure 8:
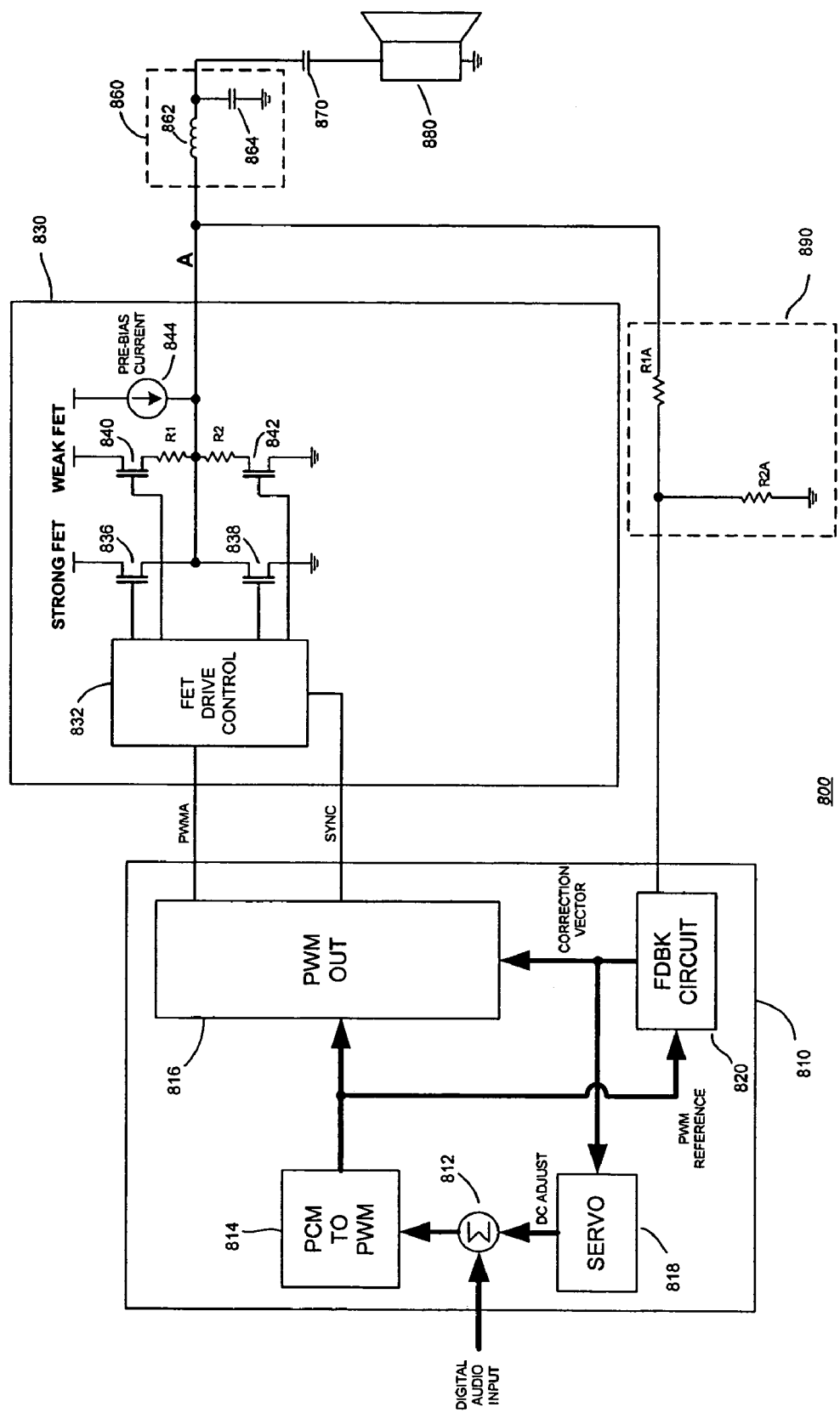
FIG. 8 illustrates another embodiment of a digital audio system.

In addition, although an amplifier having a full-bridge configuration that uses a pair of half-bridge circuits (outputs A and B) is shown in FIG. 1, the amplifier can contain only one half-bridge. Such an embodiment is shown in FIG. 8. As shown, there are differences between the amplifiers of FIGS. 1 and 8. Similar to the embodiment of FIG. 1, the closed loop amplifier system 800 in FIG. 8 includes a digital amplifier controller IC 810, a power amplifier stage IC 830, LC filter 860, coupling capacitor 870, speaker 880, and attenuator 890. The controller IC 810 contains a summer 812, PCM to PWM converter 814, PWM adjuster 816, servo 818, and feedback circuit 820. The power stage IC 830 contains a field effect transistor (FET) drive controller 832. Associated with the FET drive controller 832 are strong FETs 836 and 838 and weak FETs 840 and 842 connected in a half-bridge configuration, a pair of resistors R1 and R2, and a pre-bias current source 844. Unlike the amplifier of FIG. 1, only one FET drive controller 832 is used (others may or may not be present). The output A of the power stage IC 830 is connected with the speaker 880. However, in this case, both the LC filter 860 and a large separate coupling capacitor 870 are disposed between the power stage IC 830 and the speaker 880. In addition, rather than the speaker 880 being connected to outputs A and B of the power stage IC 830, one side of the speaker 880 is connected to ground.

Turning back to a more detailed description of the servo 118, although not shown, the servo 118 includes a simple integrator that works to zero the correction vector of the feedback circuit 120. The correction vector is derived from the 7-bit output of the ADC in the feedback circuit 120. The servo integrator equation is as follows:

$$dc(n)=dc(n-1)-[1/k]*\text{correction}(n) \quad (1)$$

where: dc=PCM-domain dc adjust value added to the digital audio input, k=attenuation factor equal to $2^m$, where m is approximately 22, n=integer time index, correction=7-bit 2's complement correction vector from the ADC. The update rate for the integer time index, n, must be sufficiently slow to maintain stability of the servo loop. In a preferred embodiment the update rate for the integer time index, n, is user programmable in terms of the number of PWM pulse repetition periods, T, in powers of 2. In other words, the update rate will be $1/(2^rT)$. The range of settings for r may be, for example: 2, 3, 4, 5, 6, 7, 8, and 9.

As described above, the power up/down servo 118 operates by adding a DC value to the digital audio input. The digital audio input may be muted during the power up and power down sequence such that its value is identically zero. Therefore, the only signal value in the data path entering the PCM to PWM converter 114 during the power up and power down sequence is the DC adjust value determined by the servo 118.

In one embodiment, the bit length of the data within the digital signal processor for the audio path is 24 bits. The format is such that bit 23 is the sign bit, bit 22 is the digit to the left of a decimal point, and bits 21-0 are digits to the right of the decimal point. In one embodiment, the bit length of the DC adjust signal is limited to 16 bits, corresponding to bits [15:0] of the 24-bit data path fixed point representation. The DC adjust signal can be represented with a sign extension. In this embodiment the upper and lower limits for the DC adjust signal, normalized to the data path fixed point representation, is approximately ±1/128 (−42 dB). The DC adjust signal value is obtained by accumulating (integrating) the 2's complement format of the feedback correction vector from the 7-bit ADC in feedback circuit 120. This 7-bit vector is effectively added to the least significant bit of the 24-bit fixed point data path representation. This fixes the attenuation factor, k, to a value of $2^{22}$.

Saturation logic may be incorporated into the DC adjust integrator described by eqn. 1 so that no wrap around can occur. For example, if an update to the DC adjust signal were to result in a value greater than 0111111111111111, then the updated value for the DC adjust signal is limited to 0111111111111111. Likewise, if the update to the DC adjust signal were to result in a value lower than 1000000000000000, then the updated value for the DC adjust signal is limited to 1000000000000000.

Read/write access of the DC adjust signal may be also implemented. Read access allows the dc adjust value to be monitored. Write access permits the user to program a given start value for the servo 118.

Control of the power up and power down sequences may occur through the manipulation of control bits under software control. Alternatively, control of the power up and power down sequences may occur in hardware utilizing a custom state machine.

Thus, a closed loop audio amplifier system and method of powering up and powering down the system are provided. The system and method eliminate audible artifacts generated during the power up and power down sequence. The system contains a switching amplifier having a plurality of outputs, an LC filter for each output connected to the switching amplifier, and a speaker connected with the switching amplifier through the LC filters. The switching amplifier has a controller IC and a power stage IC.

The controller integrated circuit (IC) includes a summer, a PCM to PWM converter, a pulse width modulation adjuster, and a feedback circuit. The servo is connected with the pulse width modulation adjuster through the summer and PCM to PWM converter. The summer combines input digital audio signals supplied to the input of the switching amplifier and an output of the servo to form a combined signal. The PCM to PWM converter receives the combined signal and converts the combined signal into the pulse width modulated signals. The pulse width modulation adjuster provides adjusted pulse width modulated signals and a synchronization signal based on pulse width modulated signals supplied thereto. The timing of the synchronization signal from the pulse width modulation adjuster is programmable. The feedback circuit is connected with the pulse width modulation adjuster and the servo and receives output signals of the switching amplifier and supplies a correction vector to the pulse width modulation adjuster to adjust widths of the adjusted pulse width modulated signals in response to the received output signals.

The power stage IC includes a driver connected with the pulse width modulation adjuster, high impedance and low impedance FETs whose gates are connected to the driver, and a prebias current source to charge the capacitors in the LC filters. The driver receives the adjusted pulse width modulated signals and the synchronization signal and supplies switch signals to the FETs. The gates of the high impedance FETs of each output are connected to a different output of the driver than the low impedance FETs of the channel. The FETs receive the switch signals and supply the output signal of the switching amplifier for the channel. The order the feedback circuit is adjustable dependent on which of the low impedance and the high impedance switches are being driven. In addition, a separate attenuator may be connected between the high impedance and low impedance FETs of each output and the feedback circuit to attenuate the output signal of the power stage IC to an acceptable level for the feedback circuit.

During power up, a prebias current is provided to each output connected to increase the voltage to a nominal output level. The high impedance FETs are then driven at a 50% duty cycle. Feedback from the output is supplied to the servo, which fine tunes the output voltage. The low impedance FETs are then driven at a 50% duty cycle at a quarter cycle timing. The order of the feedback loop is increased from when the high impedance FETs are driven to when the low impedance FETs are driven. The prebias current is then removed before audio signals to be amplified are supplied to the system. To power down, essentially the reverse sequence is provided.

Figure 9:
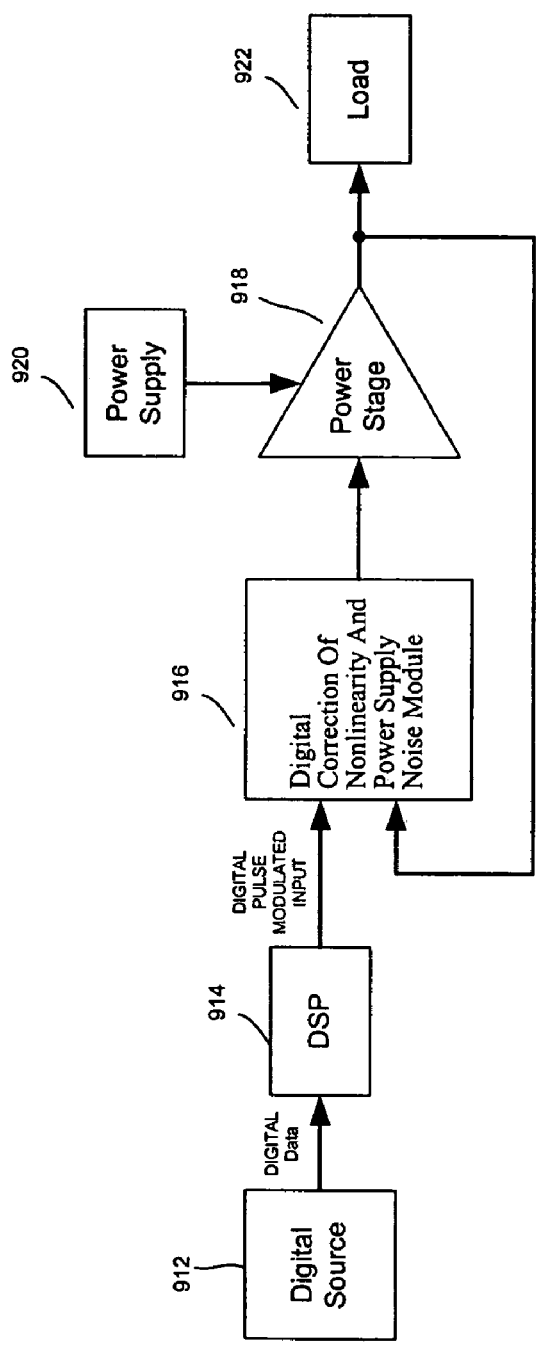
FIG. 9 illustrates an overall embodiment of a digital audio system.

Turning to one embodiment of an overall structure, FIG. 9 illustrates a switching amplifier system 900 having digital correction for error created by nonlinearity and power supply noise. A digital source 912 has an output for providing the digital audio input shown in FIG. 1 to an input of a digital signal processor 914. The digital signal processor function may be implemented either in software or with hardware components. It should be understood that the digital signal processor 914 may be any type of signal processing function that processes in some predetermined manner the received digital data, for example, the PCM to PWM converter 114 of FIG. 1. An output of the digital signal processor 914 is connected to an input of a digital correction of nonlinearity and power supply noise module 916. The digital correction of nonlinearity and power supply noise module 916 functions as a digital correction circuit. In one embodiment, the digital correction of nonlinearity and power supply noise module 916 may comprise the PWM adjuster 116 and the feedback circuit 120. An output of the digital correction of nonlinearity and power supply noise module 916 is connected to an input of the power stage 918 for providing a corrected digital pulse modulated signal. The power stage 918 may comprise power stage IC 130. An output of the power stage 918 is connected to an input of a load 922 (such as the speaker 180) and to a feedback input of the digital correction of nonlinearity and power supply noise module 916. The output of the power stage 918 provides an amplified pulse modulated output signal. A power supply 920 supplies the power stage 918 with power.

In operation, digital source 912 provides digital data to the digital signal processor 914. The digital data may be music or any other form of information. The digital signal processor 914 processes the digital data by converting its form. In one embodiment, the digital signal processor 914 modulates the digital data using pulse modulation. Two forms of pulse modulation include pulse width modulation (PWM) and pulse density modulation (PDM). In a preferred form, the digital signal processor 914 modulates the digital data using PWM. It should be noted that the function of the digital signal processor 914 may be implemented using either software code or by performing the modulation in hardware. A digital pulse modulated signal is then presented to the digital correction of nonlinearity and power supply noise module 916 which functions to correct errors originating from nonlinearity and power supply noise. A corrected digital pulse modulated signal is presented to the power stage 918 that amplifies or level shifts the digital pulse modulated signal to provide an amplified pulse modulated signal output. The amplified pulse modulated signal output may be used to drive a load. The load 922 may be implemented as any type of load, such as a speaker if the digital data is music or audio information. In some applications, a low pass filter (shown in FIG. 1) is connected between the power stage 918 and the load 922. The low pass filter prevents the switching frequency and its harmonics from being coupled to the load. The power supply 920 is used to power the power stage 918 and determines the supply voltage rail value that a logic one output value will have. The digital output of power stage 918 is also used as a feedback signal to the digital correction of nonlinearity and power supply noise module 916 to provide digital correction for the digital switching amplifier.

Although some of the components of the system are described as being provided in an integrated circuit, they may be provided as discrete elements. For example, the FETs and/or feedback circuit may be discrete elements. In another embodiment, the output of the servo can be supplied to the feedback circuit as a reference signal instead of being supplied to the PCM to PWM conveder. In a different embodiment, the servo signal may be supplied to one or more of the current sources in the power amplifier IC rather than to the summer. In this case, the current sources provide currents of different magnitudes which are adjusted by the output from the servo.

Note that the specification and figures are to be regarded in an illustrative rather than a restrictive sense, and all such modifications are intended to be included withing the scope of present invention. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. A switching amplifier having a plurality of outputs, comprising:
    a pulse width modulation adjuster operative to provide adjusted pulse width modulated signals and a synchronization signal based on pulse width modulated signals supplied thereto;
    a driver connected with the pulse width modulation adjuster, the driver operative to receive the adjusted pulse width modulated signals and the synchronization signal and supply switch signals in response thereto;
    a plurality of high impedance and low impedance switches connected with the driver such that control terminals of the high impedance switches of each output are connected to a different output of the driver than the low impedance switches of the output, the high impedance and low impedance switches of each output operative to receive the switch signals and supply an output signal to the output; and
    a feedback circuit connected with each output and with the pulse width modulation adjuster, the feedback circuit operative to receive the output signals and to supply a correction vector to the pulse width modulation adjuster to adjust widths of the adjusted pulse width modulated signals in response to the received output signals.

2. The switching amplifier of claim 1, further comprising a servo connected with the feedback circuit and with the pulse width modulation adjuster, the servo operative to receive the correction vector and to alter widths of the pulse width modulated signals in response thereto.

3. The switching amplifier of claim 2, further comprising:
    a summer connected with the servo and an input of the switching amplifier, the summer operative to combine input digital signals supplied to the input of the switching amplifier and an output of the servo to form a combined signal; and
    a PCM to PWM converter connected between the summer and the pulse width modulation adjuster, the PCM to PWM converter operative to receive the combined signal and convert the combined signal into the pulse width modulated signals, the PCM to PWM converter connected with the feedback circuit such that the pulse width modulated signals are supplied to the feedback circuit,
    wherein the servo is connected with the pulse width modulation adjuster through the summer and PCM to PWM converter.

4. The switching amplifier of claim 1, further comprising a pre-bias source connected to each output, the pre-bias source operative to change a voltage level of the output.

5. The switching amplifier of claim 4, further comprising an LC filter connected to each output, each pre-bias source comprising a pre-bias current source operative to charge a capacitor of the LC filter.

6. The switching amplifier of claim 1, further comprising an attenuator connected between the high impedance and low impedance switches of each output and the feedback circuit, the attenuator of each output operative to attenuate the output signal of the output to an acceptable level for the feedback circuit.

7. The switching amplifier of claim 1, wherein the pulse width modulation adjuster is programmable such that a timing of the synchronization signal is adjustable.

8. The switching amplifier of claim 1, wherein an order of the feedback circuit is adjustable dependent on which of the low impedance and the high impedance switches are being driven.

9. The switching amplifier of claim 1, further comprising a servo connected with the feedback circuit, the servo operative to receive the correction vector and to provide a reference signal to the feedback circuit.

10. The switching amplifier of claim 4, further comprising a servo connected with at least one of the pre-bias sources, the servo operative to receive the correction vector and to adjust a signal of the at least one of the pre-bias sources.

11. A method of operating a switching amplifier having a plurality of outputs, the method comprising:
    producing a pulse width modulated signal;
    adjusting a width of pulses of the pulse width modulated signal based on a correction vector to form adjusted pulse width modulated signals;
    driving a plurality of high impedance and low impedance switches of each output to produce an output signal at the output based on a synchronization signal and one of the adjusted pulse width modulated signals; and
    feeding back the output signals of the outputs to produce the correction vector.

12. The method of claim 11, further comprising:
    altering a pulse code modulation (PCM) signal using an adjustment signal dependent on the correction vector; and
    producing the pulse width modulated signal based on the PCM signal.

13. The method of claim 12, further comprising:
    providing an input PCM signal to the switching amplifier; and
    summing the input PCM signal with the adjustment signal to produce the PCM signal.

14. The method of claim 11, further comprising pre-biasing each output, before driving the high impedance switches of the output, to change a voltage level of the output.

15. The method of claim 11, further comprising attenuating the output signal of each output to an acceptable level before feeding back the output signals to produce the correction vector.

16. The method of claim 11, further comprising driving the high impedance switches of each output prior to driving the low impedance switches of the output when powering up the switching amplifier, and driving the high impedance switches of each output after driving the low impedance switches of the output when powering down the switching amplifier.

17. The method of claim 16, wherein the low impedance and high impedance switches of each output are driven using a 25% duty ratio single pulse at quarter cycle timing and then with 50% duty ratio pulses.

18. The method of claim 11, further comprising programming a timing of the synchronization signal to adjust driving of the low impedance and the high impedance switches of each output.

19. The method of claim 11, further comprising adjusting an order of the feedback dependent on which of the low impedance and the high impedance switches are being driven.

20. An audio system comprising:
a switching amplifier having a plurality of outputs, the switching amplifier comprising:
a controller integrated circuit (IC) that includes: a pulse width modulation adjuster operative to provide adjusted pulse width modulated signals and a synchronization signal based on pulse width modulated signals supplied thereto; and a feedback circuit connected with each output and with the pulse width modulation adjuster, the feedback circuit operative to receive output signals of the switching amplifier and to supply a correction vector to the pulse width modulation adjuster to adjust widths of the adjusted pulse width modulated signals in response to the received output signals; and
a power stage IC that includes: a driver connected with the pulse width modulation adjuster, the driver operative to receive the adjusted pulse width modulated signals and the synchronization signal and supply switch signals in response thereto; and a plurality of high impedance and low impedance switches connected together and having control terminals connected with the driver, the control terminals of the high impedance switches of each output connected to a different output of the driver than the low impedance switches of the output, the high impedance and low impedance switches of each output operative to receive the switch signals and supply the output signal of the switching amplifier for the output;
an LC filter connected to each output of to power stage IC; and
a speaker connected to the LC filters.

21. The audio system of claim 20, wherein the controller further comprises:
a servo connected with the feedback circuit and with the pulse width modulation adjuster, the servo operative to receive the correction vector and to alter widths of the pulse width modulated signals in response thereto;
a summer connected with the servo and an input of the switching amplifier, the summer operative to combine input digital signals supplied to the input of the switching amplifier and an output of the servo to form a combined signal; and
a PCM to PWM converter connected between the summer and the pulse width modulation adjuster, the PCM to PWM converter operative to receive the combined signal and convert the combined signal into the pulse width modulated signals, the PCM to PWM converter connected with the feedback circuit such that the pulse width modulated signals are supplied to the feedback circuit,
wherein the servo is connected with the pulse width modulation adjuster through the summer and PCM to PWM converter.

22. The audio system of claim 20, wherein the power stage IC further comprises a pre-bias current source connected with each output, the pre-bias source operative to charge a capacitance of the LC filter of the output.

23. The audio system of claim 20, further comprising an attenuator connected between the high impedance and low impedance switches of each output and the feedback circuit, the attenuator of each output operative to attenuate the output signal of the output to an acceptable level for the feedback circuit.

24. The audio system of claim 20, wherein the pulse width modulation adjuster is programmable such that a timing of the synchronization signal is adjustable.

25. The audio system of claim 20, wherein an order the feedback circuit is adjustable dependent on which of the low impedance and the high impedance switches are being driven.

* * * * *

UNITED STATES PATENT AND TRADEMARK OFFICE
CERTIFICATE OF CORRECTION

PATENT NO. : 7,312,654 B2 Page 1 of 1
APPLICATION NO. : 11/314203
DATED : December 25, 2007
INVENTOR(S) : William J. Roeckner et al.

It is certified that error appears in the above-identified patent and that said Letters Patent is hereby corrected as shown below:

Column 16, in claim 25, line 1, after "wherein an order" insert --of--.

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,312,654 B2 |
| APPLICATION NO. | : 11/314203 |
| DATED | : December 25, 2007 |
| INVENTOR(S) | : William J. Roeckner |

It is certified that error appears in the above-identified patent and that said Letters Patent is hereby corrected as shown below:

In Column 16, Line 1, Claim No. 20:

Change "an LC filter connected to each output of to power stage" to --an LC filter connected to each output of the power stage--

Signed and Sealed this

First Day of July, 2008

JON W. DUDAS
*Director of the United States Patent and Trademark Office*